United States Patent [19]
Chua et al.

[11] Patent Number: 5,780,919
[45] Date of Patent: *Jul. 14, 1998

[54] ELECTRICALLY PROGRAMMABLE INTERCONNECT STRUCTURE HAVING A PECVD AMORPHOUS SILICON ELEMENT

[75] Inventors: Hua-Thye Chua, Los Altos; Andrew K. Chan, Palo Alto; John M. Birkner, Portola Valley; Ralph G. Whitten, San Jose; Richard L. Bechtel, Sunnyvale; Mammen Thomas, San Jose, all of Calif.

[73] Assignee: QuickLogic Corporation, Sunnyvale, Calif.

[*] Notice: The term of this patent shall not extend beyond the expiration date of Pat. No. 5,502,315.

[21] Appl. No.: 646,823

[22] Filed: May 21, 1996

Related U.S. Application Data

[63] Continuation of Ser. No. 447,969, Dec. 8, 1989, which is a continuation-in-part of Ser. No. 404,996, Sep. 7, 1989, abandoned.

[51] Int. Cl.$^6$ ........................................... H01L 29/00
[52] U.S. Cl. ........................... 257/530; 257/50; 257/209
[58] Field of Search ........................ 257/50, 530, 209

[56] References Cited

U.S. PATENT DOCUMENTS

| | | | |
|---|---|---|---|
| 3,611,063 | 10/1971 | Neale | 317/234 |
| 3,619,732 | 11/1971 | Neale | 317/234 |
| 3,629,863 | 12/1971 | Neale | 340/173 |
| 3,634,927 | 1/1972 | Neale et al. | 29/576 |
| 3,675,090 | 7/1972 | Neale | 317/234 R |
| 3,677,814 | 7/1972 | Gillery et al. | 117/211 |
| 3,699,543 | 10/1972 | Neale | 340/173 |
| 3,775,174 | 11/1973 | Neale | 117/212 |
| 3,792,319 | 2/1974 | Tsang | 317/235 |
| 4,174,521 | 11/1979 | Neale | 357/45 |
| 4,199,692 | 4/1980 | Neale | 307/238 |
| 4,217,374 | 8/1980 | Ovshinsky et al. | 427/39 |
| 4,225,946 | 9/1980 | Neale et al. | 365/163 |
| 4,226,898 | 10/1980 | Ovshinsky et al. | 427/39 |

(List continued on next page.)

FOREIGN PATENT DOCUMENTS

| | | | |
|---|---|---|---|
| 2 566 682 | 6/1985 | France | B05D 1/32 |
| 8600059 | 1/1986 | Netherlands | C30B 35/00 |
| 2 086 654 | 5/1982 | United Kingdom | H01L 45/00 |
| WO 82/01482 | 5/1982 | WIPO | B05D 1/00 |
| WO 87/02827 | 5/1987 | WIPO | H01L 27/24 |

OTHER PUBLICATIONS

Bogdan, Albert A., "An Electrically Programmable Silicon Circuit Board", Mosaic Systems, Inc., pp. 472–476.
Cole, B., "ICC Takes the Antifuse One Step Further", Electronics, Mar. 1989, p. 87.
Cole, B., "Programmable Logic Devices: Faster, Denser, and a Lot More of Them", Electronics, Sep. 17, 1987, pp. 61–72.

(List continued on next page.)

*Primary Examiner*—J. Carroll
*Attorney, Agent, or Firm*—Skjerven, Morrill, MacPherson, Franklin and Friel; T. Lester Wallace

[57] ABSTRACT

In one method for forming amorphous silicon antifuses with significantly reduced leakage current, a film of amorphous silicon is formed in a antifuse via between two electrodes. The amorphous silicon film is deposited using plasma enhanced chemical vapor deposition, preferably in an silane-argon environment and at a temperature between 200 and 500 degrees C., or reactively sputtered in a variety of reactive gases. In another method, an oxide layer is placed between two amorphous silicon film layers. In yet another method, one of the amorphous silicon film layers about the oxide layer is doped. In another embodiment, a layer of conductive, highly diffusible material is formed either on or under the amorphous silicon film. The feature size and thickness of the amorphous silicon film are selected to minimize further the leakage current while providing the desired programming voltage. A method also is described for forming a field programmable gate array with antifuses.

3 Claims, 5 Drawing Sheets

U.S. PATENT DOCUMENTS

| | | | |
|---|---|---|---|
| 4,228,524 | 10/1980 | Neale et al. | 365/163 |
| 4,312,046 | 1/1982 | Taylor | 365/104 |
| 4,424,578 | 1/1984 | Miyamoto | 365/104 |
| 4,431,271 | 2/1984 | Okubo | 350/334 |
| 4,442,507 | 4/1984 | Roesner | 365/100 |
| 4,458,297 | 7/1984 | Stopper et al. | 361/403 |
| 4,467,400 | 8/1984 | Stopper | 361/403 |
| 4,479,088 | 10/1984 | Stopper | 324/73 |
| 4,499,557 | 2/1985 | Holmberg et al. | 365/163 |
| 4,517,223 | 5/1985 | Ovshinsky et al. | 427/39 |
| 4,532,702 | 8/1985 | Gigante et al. | 29/578 |
| 4,545,111 | 10/1985 | Johnson | 29/574 |
| 4,569,121 | 2/1986 | Lim et al. | 29/574 |
| 4,590,589 | 5/1986 | Gerzberg | 365/100 |
| 4,599,705 | 7/1986 | Holmberg et al. | 365/163 |
| 4,621,260 | 11/1986 | Suzuki et al. | 340/719 |
| 4,651,409 | 3/1987 | Ellsworth et al. | 29/576 |
| 4,726,851 | 2/1988 | Matsumura et al. | 136/258 |
| 4,748,490 | 5/1988 | Hollingsworth | 357/51 |
| 4,771,015 | 9/1988 | Kanai et al. | 437/109 |
| 4,786,904 | 11/1988 | Graham, III et al. | 340/825 |
| 4,823,181 | 4/1989 | Mohsen et al. | 357/51 |
| 4,847,732 | 7/1989 | Stopper et al. | 361/395 |
| 4,866,006 | 9/1989 | Imagawa et al. | 437/101 |
| 4,876,668 | 10/1989 | Thakoor et al. | 365/163 |
| 4,882,293 | 11/1989 | Naumann et al. | 437/52 |
| 4,914,055 | 4/1990 | Gordon et al. | 437/192 |
| 4,933,898 | 6/1990 | Gilberg et al. | |
| 5,070,384 | 12/1991 | McCollum et al. | 357/51 |
| 5,093,711 | 3/1992 | Hirakawa | 357/71 |
| 5,181,096 | 1/1993 | Forouhi | 257/530 |
| 5,502,315 | 3/1996 | Chau et al. | 257/50 |

OTHER PUBLICATIONS

Gordon, K. and Wong, R., "Conducting Filament of the Programmed Metal Electrode Amorphous Silicon Antifuse", *IEDM 93* (Dec. 1993) pp. 27–30.

Iversen, W., "Amorphous vias in wafer link chips", *Electronics*, vol. 56, No. 19, Sep. 22, 1983, pp. 48–49.

Iversen, W., "Amorphous switches add PROM density", *Electronics*, vol. 57, No. 7, Apr. 5, 1984, p. 54.

Millman, J. and Halkias, C., *Integrated Electronics: Analog and Digital Circuits and Systems*, McGraw–Hill Book Company, New York, 1972, pp. 58–59.

Raffel, J., et al., "Laser Programmed Vias for Restructurable VLSI", Massachusetts Institute of Technology, Lincoln Laboratory, *International Electron Devices Meeting*, 1980, pp. 132–135.

Raffel, J., et al., "A Demonstration of Very Large Area Integration Using Restructurable Laser Links", Massachusetts Institute of Technology, Lincoln Laboratory, *IEEE ISSCC 1982*, 9 pages.

Raffel, J., et al., "A Wafer–Scale Digital Integrator", IEEE International Conference on Computer Designs VLSI in Computers, Oct. 1984, pp. 121–126

Semiconductor Devices *"Physics and Technology"*, S.M. Sze, AT&T Bell Laboratories, Dielectric Deposition, pp. 354–356.

Vossen, J. and Kern, W., *"Thin Film Processes"*, Academic Press, pp. 525–564, (1991).

Wyatt, P., et al., "Process Considerations in Restructurable VLSI for Wafer–Scale Integration", Massachusetts Institute of Technology, Lincoln Laboratory, International Electron Devices Meeting, Dec. 1984, pp. 626–629.

"Rad–Hard Verticle Anti–Fuse Technology Reduces IC Geometry", Defense Electronics, vol. 26, No. 5, May 1994, p. 12.

A.C. Adams, "Plasma Deposition of Inorganic Films", *Solid State Technology*, Apr. 1983, pp. 135–139.

J.A. Burns et al., "Applications of Plasma–Deposited SiN to Wafer–Scale Integrated Circuits," vol. ED–34, No. 11 Nov. 1987, *IEEE Transactions on Electron Dev.*, pp. 2374–2375.

R.C. Chittick et al., "The Preparation and Properties of Amorphous Silicon," *J. Electrochem Soc.: Solid State Science*, Jan. 1969, pp. 77–81.

Brian Cook et al., "Amorphous Silicon Antifuse Technology for Bipolar PROMS", 1986, Bipolar Circuits and Technology Meeting, pp. 99–100.

Khaled El–Ayat et al., "A CMOS Electrically Configurable Gate Array," 1988, *IEEE International Solid State Circuits Conference*, pp. 76–77.

Esmat Hamdy et al., "Dielectric Based Antifuse for Logic and Memory ICs," 1988, *IEEE IEDM 88*, pp. 786–789.

J.C. Knights et al., "Microstructure of Plasma–Deposited a–Si:H Films," *Appl. Phys. Lett.* 35(3), 1 Aug. 1979, pp. 244–246.

D.L. Morel et al., "Effect of Hydrogen on the Diode Properties of Reactively Sputtered Amorphous Silicon Schottky Barrier Structures", *Appl. Phys. Lett.*, vol. 39, No. 8, Oct. 1981, pp. 612–614.

Yosi Shacham–Diamand et al., "A Novel Ion–Implanted Amorphous Silicon Programmable Element," 1987, IEDM 87, pp. 194–197.

Herbert Stopper, "A Wafer with Electrically Programmable Interconnections," 1985, *IEEE International Solid–State Circuits Conference*, pp. 268–269.

Stanley Wolf et al. "Ion Implanation for VLSI," Lattice Press, 1986, pp. 280–283.

ELECTRICALLY PROGRAMMABLE INTERCONNECT STRUCTURE HAVING A PECVD AMORPHOUS SILICON ELEMENT

CROSS-REFERENCE TO RELATED APPLICATIONS

This application is a continuation of application Ser. No. 07/447,969, filed Dec. 8, 1989, which is a continuation-in-part of application Ser. No. 07/404,996, filed Sep. 7, 1989, now abandoned.

BACKGROUND OF THE INVENTION

1. Field of the Invention

The present invention relates to programmable integrated circuit structures and methods for fabrication thereof, and more particularly to amorphous silicon antifuses and circuits and routing structures incorporating antifuses.

2. Description of Related Art

Programmable semiconductor devices include programmable read only memories ("PROMs"), programmable logic devices ("PLDs"), and programmable gate arrays. Programmable elements suitable for one or more of these device types include fuses and antifuses.

A fuse is a structure which electrically couples a first terminal to a second terminal, but which, when programmed by passage of sufficient current between its terminals, electrically decouples the first terminal from the second terminal. A fuse typically is of a conductive material which has a geometry that causes portions of the conductive fuse material to physically separate from each other when heated to the extent that an open circuit results.

An antifuse is a structure which when unprogrammed does not electrically couple its first and second terminals, but which, when programmed by applying sufficient voltage between the first and second terminals, permanently electrically connects the first and second terminals. One type of antifuse comprises a highly resistive material between two terminals of conductive material, the antifuse material being such that when sufficient voltage is applied, the resulting current heats the materials and causes portions of the conductive material to extend into the resistive material and form a permanent conductive path. Another type of antifuse comprises an amorphous silicon which forms conductive polysilicon when heated. In PROM devices, for example, the advantages of the antifuse technology over fuse technology include scalability and reduced programming current requirement. Various antifuses are disclosed in U.S. Pat. No. 3,675,090, issued Jul. 4, 1972 to Neale, and U.S. Pat. No. 3,792,319, issued Feb. 12, 1974 to Tsang.

The use of amorphous silicon in the fabrication of semiconductor threshold and switch devices is well known. As more fully discussed in the aforementioned Neale patent, various semiconductor switch devices comprise a "pore" filled with amorphous silicon, which contacts a lower electrode forming surface and an upper electrode forming surface. The electrodes are variously described as comprising a refractory material alone (Neale, FIG. 4), a refractory material connected at its upper surface to an aluminum conductor (Neale, FIG. 6), a refractory material overlaying an aluminum conductor (Neale, FIGS. 8–9), and a refractory material connected at its end to an aluminum conductor (Neale, FIG. 11).

Neale recognized that two important objectives were to obtain switch devices with a very low leakage current in the preprogrammed condition and a fairly consistent programming voltage value. An aspect of the Neale invention was to fabricate the semiconductor switch device so as to present a very small cross-sectional area of semiconductor material for current flow to minimize leakage current paths therethrough. Unfortunately, these measures alone are insufficient to achieve low leakage current along with a low and consistent programming voltage, which is desired in many applications.

Antifuses have been used successfully in programmable interconnect substrates, memories, and some types of PLDS.

An antifuse suitable for use in an electrically programmable interconnection substrate is disclosed in U.S. Pat. No. 4,458,297, issued Jul. 3, 1984 to Stopper et al. A silicon substrate for hybrid circuits is divided into discrete areas for hosting integrated circuit chips and providing the bonding pads for the signal connections between the chips and the substrate. Transverse pad lines and net lines are provided, which are insulated at the crossover points except for respective via holes, each furnished with a pad of amorphous silicon material. The lines are arranged so that a number of pads can be connected to each other as desired by programming. See also Herbert Stopper, "A Wafer with Electrically Programmable Interconnections," in Proceedings of the International Solid State Circuits Conference, Feb. 15, 1985, pp. 263–269.

Antifuses used in interconnect substrates tend to require high programming voltages and currents. As the interconnection substrate does not contain sensitive integrated active semiconductor devices, and as programming is completed prior to attachment and bonding of the functional die, the antifuses between the pad and net lines are designed to minimize the leakage current, and do not minimize the programming current and programming voltage.

Specifically, the device described by Stopper requires that a threshold voltage of 20 volts be exceeded to initiate the switching process into the programmed state. Many devices designed to operate at 5 volts (the typical integrated circuit operating voltage) cannot tolerate voltages as high as 20 volts due to junction breakdown voltages between 12–20 volts. Although higher junction breakdown voltages can be obtained in integrated circuits, thicker insulation layers throughout the circuit, larger transistors, lower doping levels, and other component adjustments must be provided. These changes cause a reduction in the operating frequency as well as an increase in the size of the circuit. Thus a higher breakdown voltage is accompanied by a direct trade-off in circuit performance.

Figure 1:
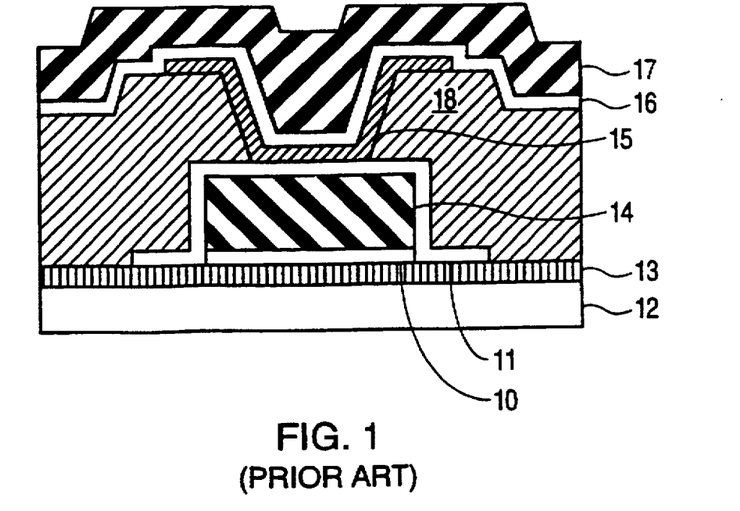
FIGS. 1 and 2 are cross section illustrations of prior art amorphous silicon antifuse structures.
Figure 2:
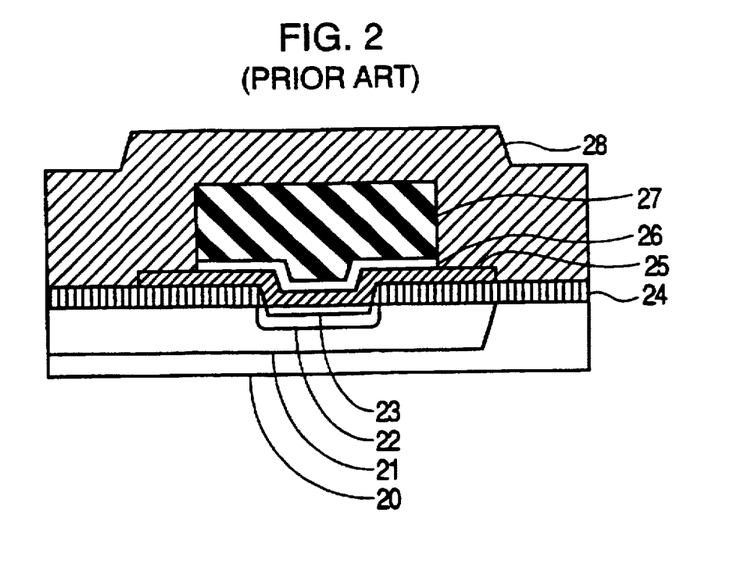

An example of antifuse technology for a bipolar PROM is illustrated in FIGS. 1 and 2, which are taken from Brian Cook and Steve Keller, "Amorphous Silicon Antifuse Technology for Bipolar PROMs," 1986 Bipolar Circuits and Technology Meeting, 1986, pp. 99–100.

In the via antifuse of FIG. 1, first metal comprising aluminum conductor 14 and barrier metal 10 and 11 is provided on an oxide layer 13 overlaying substrate 12. A thick oxide layer 18 is provided over conductor 14 as insulation from second metal. A via etched into oxide layer 18 is lined with a thin film of amorphous silicon 15, which fully overlays and contacts the barrier metal 11 under the via. Second metal comprising barrier metal 16 and aluminum conductor 17 is provided over the via, in contact with the amorphous silicon 15.

The contact antifuse of FIG. 2 is formed over a transistor comprising collector 20, base 21, and emitter 22. Emitter contact is made to a platinum silicide region 23 through a contact hole in oxide 24, which is lined with amorphous silicon film 25. Barrier metal 26 and aluminum conductor 27 overlay the amorphous silicon 25, and are protected by oxide 28.

In the examples of FIGS. 1 and 2, the deposition of the amorphous silicon was a critical step in the process, as the thickness of the film 15 (FIG. 1) and film 25 (FIG. 2) was thought to control the programming voltage. The pre-programmed leakage current was reduced to about 6 microamperes at 2 volts by a high temperature anneal at 450 degrees C. Other factors thought to influence leakage current in the undoped amorphous silicon antifuse were feature size (leakage current proportional) and film thickness (leakage current inversely proportional).

Unfortunately, antifuse technology developed for use in memories is generally too leaky for use in PLDs, as noted by Cook et al. In a PROM, one bit is selected per output at a time; therefore, if the programmable elements are leaky, only one leaky bit loads the sense amplifier. Usually the sense amplifier can tolerate this loading without drastically affecting its functionality or performance. Contrast one type of PLD known as a programmable array logic, which is implemented using PROM technology. The programmable elements are used to configure logic (routing is dedicated and global). In programmable array logic, multiple bits can be accessed and may overload the sense line if the programmable elements are leaky. Overloading the sense line may drastically degrade the performance and in the extreme case, result in functional failure.

Certain techniques have been employed in PLDs using antifuse technology to overcome the problems created by antifuse leakage. One technique uses active semiconductor devices such as diodes or transistors to block the leakage current, an approach which can also be used in memories having leaky antifuses. While this approach is satisfactory in memories and in the logic configuration circuits of PLDs, the technique is not satisfactory for use in the routing circuits of such integrated circuits as the field programmable gate array ("FPGA").

The FPGA, which is distinguished from conventional gate arrays by being user programmable, otherwise resembles a conventional gate array in having an interior matrix of logic blocks and a surrounding ring of I/O interface blocks. Logic functions, I/O functions, and routing of interconnect networks are all user configurable, which affords high density and enormous flexibility suitable for most logic designs. User logic, for example, conventionally is implemented by interconnecting two-input NAND gates into more complex functions. Extensive user configurability of the FPGA is achieved by incorporating a large number of programmable elements into the logic and I/O blocks and the interconnect network. Naturally, the leakage requirement of the programmable elements is stringent, due to the large number of possible connections generally involved and the numerous failure modes that leakage can cause. For instance, leaky programmable elements in the routing areas contribute to high supply current problems, cross talk problems, and performance degradation.

To meet the stringent leakage requirements imposed by FPGAs, conventional fuses and transistor switches generally have been employed. Antifuses using amorphous silicon have not been employed due to their excessive leakage when designed for the programming voltages and currents conventionally used in FPGAs.

SUMMARY OF THE INVENTION

Some embodiments of the amorphous silicon antifuses of the present invention offer a low leakage current while requiring programming voltages, currents, and time compatible with such devices as field programmable gate arrays.

These and other advantages are achieved in the present invention, which in one embodiment is an electrically programmable normally nonconductive antifuse for selectively interconnecting in a programmed state two conductive lines of an integrated circuit. A plasma-enhanced chemical vapor deposited amorphous silicon element is disposed between two electrodes. The element has a thickness and size so that leakage current through it is about 10 nanoamperes or less at 5.5 volts in an unprogrammed state, whereby an unprogrammed antifuse resistance of at least 550 Megohms is realized.

In another embodiment of the present invention, an antifuse having amorphous silicon material disposed between generally parallel opposing portions of an upper electrode and a lower electrode, the amorphous silicon material comprises in an unprogrammed state the type of silicon material that results from a plasma enhanced chemical vapor deposition of silicon without subsequent exposure to temperatures in excess of 500 degrees Centigrade. The opposing portions of the upper and lower electrodes are spaced apart a particular distance and have a particular area for limiting, in conjunction with the amorphous silicon material, current through the amorphous silicon to about 10 nanoamperes or less at 5.5 volts in the unprogrammed state.

BRIEF DESCRIPTION OF THE DRAWINGS

In the drawings, where like reference numerals indicate like parts.

DESCRIPTION OF THE PREFERRED EMBODIMENTS

Figure 5:
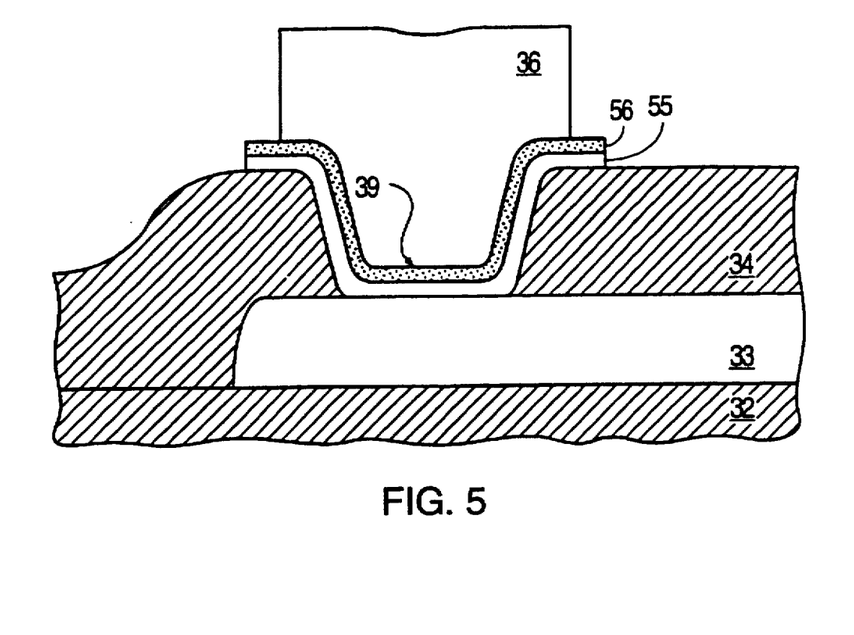
Figure 6:
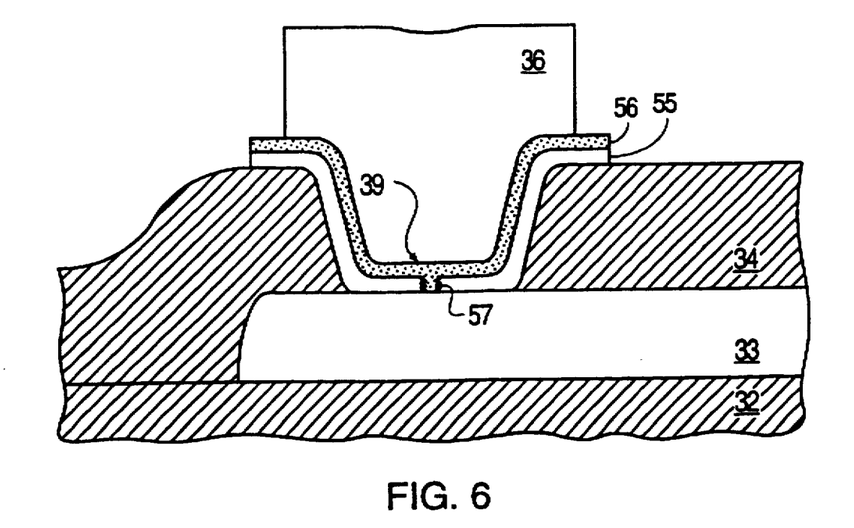
Figure 7:
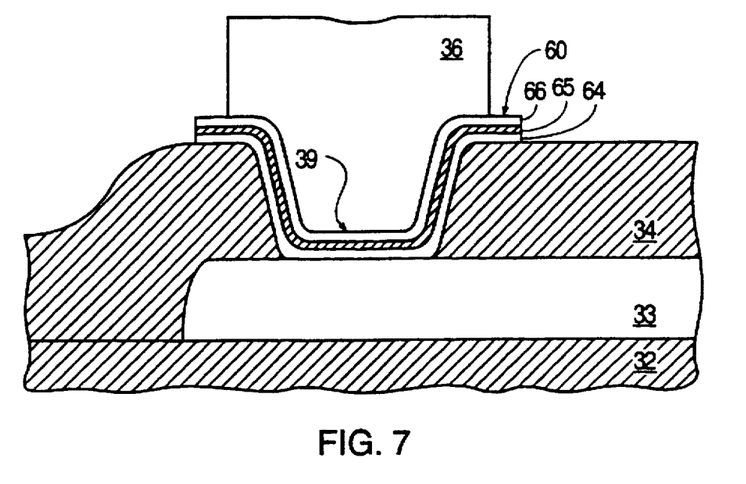

Several embodiments of antifuses suitable for use in, for example, the semiconductor structure of FIG. 7 are illustrated in FIGS. 3–6. Considerations particular to each of the embodiments are described below, followed by a description of the semiconductor structure.

The antifuses illustrated in FIGS. 3–6 include a semiconductive substrate (not shown), a dielectric layer 32, a first conductive layer 33, a second conductive layer 36, a dielectric layer 34 including via 39, and an amorphous silicon structure 35 extending into via 39 and contacting both the first conductive layer 33 and the second conductive layer 36. The first dielectric layer 32, typically silicon dioxide, is patterned to expose the substrate, typically silicon, at locations where portions of first conductive layer 33, typically polycrystalline silicon or aluminum, contact the substrate. Likewise vias such as via 39 are formed in second dielectric 34, also typically silicon dioxide, where first conductive layer 33 is to be exposed. Antifuses may be formed in some such vias of the integrated circuit and not in other vias.

The following basic steps are used in the process for forming an antifuse of this invention. A layer of dielectric 32, typically silicon dioxide, is formed on the silicon substrate, and patterned to expose portions of the the substrate. Alternatively, the dielectric layer 32 may be formed upon a lower conductive layer (not shown) rather than to the substrate. A first conductive layer 33 of, for example, aluminum or polycrystalline silicon, is formed on the dielectric 32. First conductive layer 33 is patterned to form appropriate interconnects. A second layer of dielectric 34, again typically silicon dioxide, is formed on the first conductive layer 33 and patterned to form vias such as via 39 exposing first conductive layer 33. Some of these vias, in particular via 39, will serve as sites for antifuses. Other vias, not shown, may allow for direct connection between first conductive layer 33 and a to-be-formed second conductive layer 36.

Into those vias which will have antifuses is formed the antifuse structure 35, as will be discussed. The antifuse material may extend somewhat beyond the edge of the via 39 which it fills. Next, second conductive layer 36, typically a metal such as aluminum, is applied and patterned, followed by application and patterning of a final passivation layer (not shown), typically a silicon oxide or silicon nitride.

Generally, the antifuses of FIGS. 3–6 are particularly advantageous for applications which require that the antifuse reliably does not program at a voltage below 7.5 volts and reliably programs at a voltage above 10 volts. The range between 7.5 volts and 10 volts is a guard band. Such applications also require that the antifuses pass very little current until programmed; leakage across the antifuses prior to programming of less than 10 nanoamperes at 5.5 volts is desirable.

The four illustrative antifuse structures illustrated in FIGS. 3–7 are now described.

Figure 3:
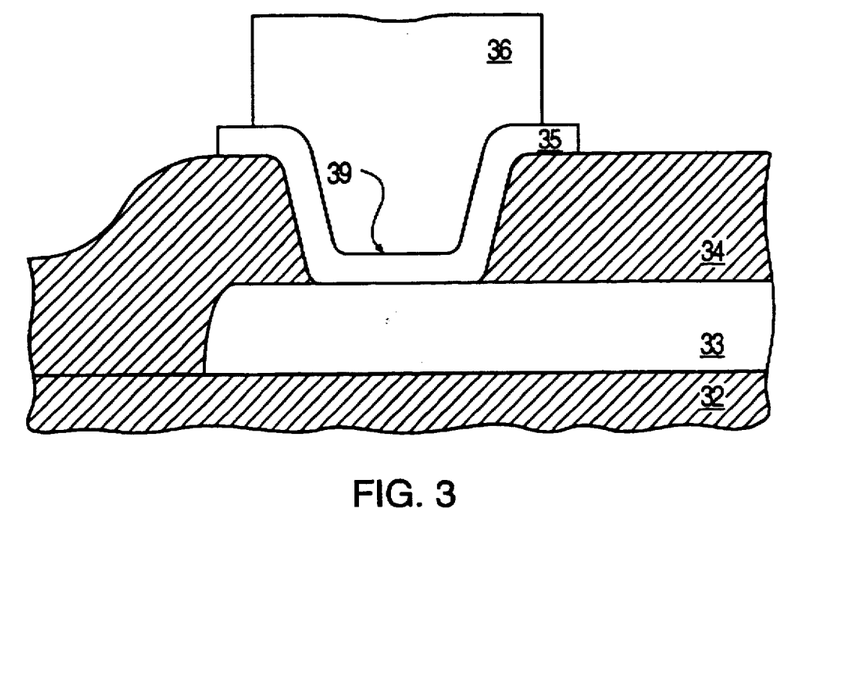
FIGS. 3–7 are cross section illustrations of specific features of various embodiments of the present invention.

The antifuse structure 35 shown in FIG. 3 is a layer of amorphous silicon film. At this point, several process and structural parameters can be identified as important, especially for amorphous silicon antifuses designed for use in FPGAs and other integrated circuit applications sensitive to leakage current. These parameters influence important characteristics of the antifuse, including trigger current (current at initiation of the programming mechanism), programming voltage (voltage at initiation of the programming mechanism), programming current (current provided to form electrical connection upon which the programmed resistance depends), programming time (period over which the programming current is maintained), leakage current, and reproducibility of the structure (necessary to maintain high yield).

The programming voltage is controlled by the thickness of the amorphous silicon film 35 in contact with the conductor 33 at the bottom of the antifuse via 39. Film 35 is deposited to a thickness of about 2000 Angstroms, which results in a programming voltage of about 12 volts. Of course, other programming voltages may be achieved by depositing film 35 to an appropriate thickness. The leakage current is controlled by several factors, including feature size and film thickness. Feature size and film thickness are selected to minimize leakage current, consistent with the process used and the programming voltage desired. In the present embodiment, the feature size is about 1.5 um and, as has been mentioned, the film thickness is 2000 Angstroms.

We have found that another factor controlling leakage current is the manner of deposition of the amorphous silicon film. In one embodiment, the amorphous silicon film 35 is deposited using plasma enhanced chemical vapor deposition ("PECVD"), rather than CVD or LPCVD. The reaction chamber used was a model GL560, manufactured by Pacific Western Systems of Mountain View, Calif. The process reactants were $SiH_4$ and argon. Certain reactive gases including oxygen, hydrogen, nitrogen, fluorine, and chlorine can be added to the basic process reactants. These reactive gases act as like dopants to modify the electrical characteristics and reduce the conductivity of the amorphous silicon. The process parameters are selected so that dopant concentration in the film is in the range of 0 to 30 atomic percent. The reaction was carried out at a temperature of 225 degrees C., although it is believed that 380 degrees C. could be advantageously used. In fact, temperatures within the range of about 200 degrees C. to about 500 degrees C. are believed suitable. The resultant deposition and evolved by-products were amorphous silicon and hydrogen.

Amorphous silicon formation by plasma enhanced chemical vapor deposition (PECVD) is described generally in A. C. Adams, "Plasma Deposition of Inorganic Films," Solid State Technology, April 1983, p. 135, hereby incorporated herein by reference thereto.

In another embodiment, the amorphous silicon film 35 is deposited using reactive ion sputtering deposition. Preferably, the amorphous silicon material 35 is deposited in one or more of the following reactive gases: oxygen, hydrogen, nitrogen, fluorine, chlorine, or argon. Amorphous silicon formation by sputter deposition is described generally in D. L. Morel and T. D. Moustakas, "Effect of hydrogen on the diode properties of reactively sputtered amorphous silicon Schottky barrier structures," Applied Physics Letters, Vol. 39, No. 8, Oct. 15, 1981, pp. 612–14, hereby incorporated herein by reference thereto.

Both PECVD and reactive ion sputtering enables the formation of an amorphous silicon film having, it is believed, small randomly oriented silicon crystals. In the case of PECVD, the character of the silicon crystals is achieved by the low temperature at which the amorphous silicon is deposited. In the case of sputter deposition as well as PECVD, the small randomly ordered character of the silicon crystals is enhanced by the interaction of reactive gases with the silicon species during deposition. These dopants tie-up dangling molecular bonds and form interstructural compounds that deter recrystallization of the amorphous silicon, thus minimizing the current leakage through the unprogrammed antifuse 35 between first and second conductive layers 33 and 36. To preserve the special character of the amorphous silicon layer 35 deposited using the PECVD or sputter deposition technique, care should be taken during subsequent processing steps to avoid sustained high temperature operations.

In both deposition techniques, the dopant incorporation into layer 35 is obtained by introducing a partial pressure of the desired dopant gas to the deposition system in which the device is being fabricated. The gases listed above are chosen specifically to reduce the conductivity of the amorphous silicon. Alternatively or additionally, doping may also be accomplished by other techniques, such as by ion implantation after deposition of antifuse material 35, followed by a rapid thermal anneal. A suitable machine for performing the rapid thermal anneal is the Heatpulse (Trademark) model 2106, available from AG Associates of Sunnyvale, Calif.

Dopant concentration is determined as follows. The lower limit of the dopant concentration is determined by the allowable leakage current of the link. The upper limit is determined by two key changes in the physical properties; namely, increased programming voltage and increased programming current. Increased programming voltage is due to increased dielectric strength of the antifuse material, and increased programming current is due to the increased difficulty of forming an alloy, conductive filament, or metallic compound, as the case may be through the antifuse material. In the case in which layers 33 and 36 are aluminum and layer 35 is silicon, the increase in programming voltage and current is due to the increased difficulty of forming an Al—Si eutectic through the antifuse which provides the low resistance after programming.

By careful control of feature size, film thickness, and manner of deposition of the amorphous silicon, an amorphous silicon antifuse with low programming voltage and low leakage current is achieved. The deposition technique described herein may be combined with various feature sizes and film thicknesses to achieve other programming voltages, while preserving a low leakage current.

Figure 4:
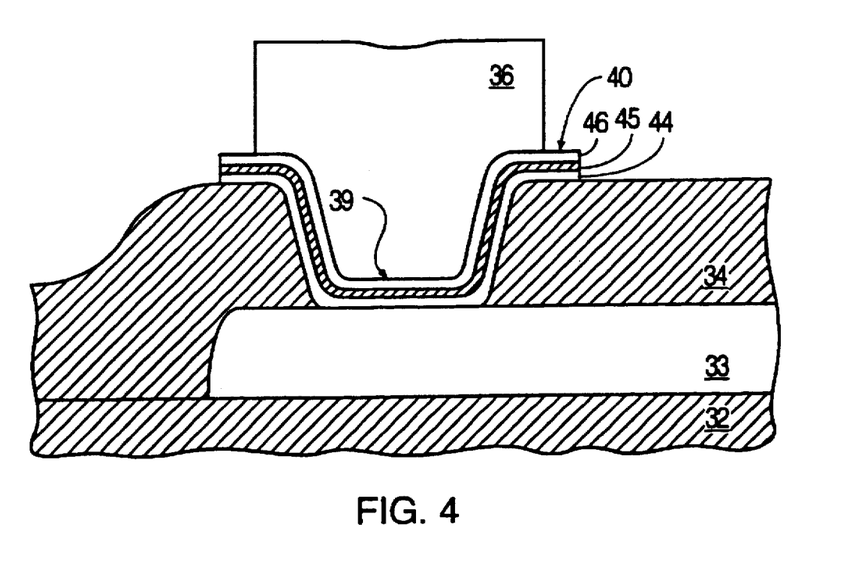

In the embodiment of FIG. 4, antifuse layer 40 comprises three layers of material, the middle layer 45 being a thin layer of dielectric. The thin dielectric layer 45 is effective in reducing the leakage current before programming without significantly increasing the required programming voltage. An oxide layer 45 only 10–20 angstroms thick can achieve this purpose. First layer 44 of antifuse layer 40 is of one of the materials described in the embodiment of FIG. 3 for forming antifuse layer 35. In the embodiment of FIG. 4, polycrystalline silicon may also be used to form layer 44. Next, thin dielectric layer 45 is formed, preferably by oxidizing the exposed polycrystalline silicon of layer 44. An effective process for producing a uniform thin oxide layer 45 is to oxidize polycrystalline silicon layer 44 at a low temperature such as, for example, 350–450 degrees C. in a standard oxidation furnace. Alternatively, or additionally, the oxidation can be achieved by subjecting layer 44 to concentrated nitric acid (70% by volume aqueous solution) at 120 degrees C. This and other oxidizing agents such as sulphuric acid and hydrogen peroxide, or oxidizing procedures such as described by Werner Kern in "Purifying Si and SiO2 Surfaces with Hydrogen Peroxide," Semiconductor International, p. 94, April 1984, may be used for producing a nonporous oxide layer 45. The thickness of oxide layer 45 is self-limiting because as layer 44 becomes covered, there is no more surface material available to be oxidized and insufficient energy for species diffusion oxidation. Layer 45 seals the surface of layer 44 everywhere layer 44 is exposed to nitric acid. Subsequently a second layer 46 of doped or undoped PECVD amorphous silicon, polycrystalline silicon or reactive sputtered silicon is formed. All three layers are patterned in the same masking step.

In the embodiment of FIG. 5, a layer 55 of silicon material having one of the compositions, doped or undoped PECVD amorphous or reactive sputtered silicon, described with respect to layer 35 of the embodiment of FIG. 3, and a thin layer 56 of a conductive, highly diffusible material such as aluminum, gold, copper, or boron (from a layer of boron nitride). The layer 56 is formed in the same masking step as the patterned layer 55, or alternatively, may be formed in the second metal masking step. Layer 56 serves as a source of conductive material (aluminum, gold, copper, or boron) for forming a conductive path 57 (see FIG. 6) during the programming process. Layer 56 must be sufficiently thick to provide adequate conductive material, and have the property of being stable at low temperatures but highly susceptible to diffusion above 400 degrees C. A layer 500–2000 Angstroms thick is generally sufficient for metals, while a layer 20–200 Angstroms thick is generally sufficient for boron nitride. As shown in FIG. 6, when a programming voltage is applied between conductive layers 33 and 36, dielectric layer 55 will be punctured along a path 57 of least resistance. Electrons flowing along this path will cause local heating. In the presence of such heating, the material in layer 56 will diffuse rapidly along path 57, forming a highly conductive alloy with silicon material of layer 55 along path 57, and providing a permanent connection between conductive layers 33 and 36 after the programming voltage is removed.

In the embodiment of FIG. 7, a three-layer antifuse layer 60 comprises a low-conductivity layer 64 of undoped PECVD amorphous silicon, undoped polycrystalline silicon, or undoped reactive sputtered amorphous silicon, adjacent to dielectric 65, which comprises a thin oxide layer similar to layer 45 of the FIG. 4 embodiment. Layer 65 is adjacent to a doped polysilicon layer 66. Layer 66 may be doped with any of the standard silicon dopants such as arsenic, boron, or phosphorus, or with any of the fast diffusing materials such as gold or copper. Layer 66 functions in a manner similar to layer 56 of the embodiment of FIGS. 5 and 6, providing a source of conductive ions to form a path through layers 65 and 64. If the combined thickness of layers 64, 65, and 66 is the same as the thickness of layer 35 of the FIG. 3 embodiment, then thin dielectric layer 65 may need to be made thicker in order to reduce pre-programming leakage current to an acceptable level. In addition, even if layers 64 and 66 were made thicker, so that layer 65 was not needed for reducing leakage current, layer 65 would under certain circumstances be desirable in order to prevent the dopants in layer 66 from diffusing into layer 64 during manufacture. All three layers 64, 65 and 66 are patterned in the same masking step.

The particular embodiments shown in FIGS. 3–7 are suitable for use in an integrated circuit having an operating voltage of 5 to 5.5 volts. The various antifuse embodiments have the ability to withstand, that is, to resist programming at an operating voltage up to 7.5 volts. As an integrated circuit generally has the ability to withstand voltages of up to 15 volts, the various antifuse embodiments are suitable for programming within a range of 10–15 volts, 12 volts being preferred for a safe operating margin. Other embodiments having other operating and programming voltages can be fabricated according to the principles described herein. For example, an antifuse for a circuit operating at 2 volts may be manufactured to program at 6 volts. For amorphous silicon, programming voltage is approximately proportional to the square root of the thickness of the antifuse material across which the voltage is applied.

Various other embodiments, which are not illustrated, include the following. In one variation, an antifuse layer comprising a layer of diffusible material such as the aluminum, gold, copper or boron nitride (a source for boron), similar to layer 56 of the FIG. 5 embodiment, is added to the three-part antifuse layer 40 of FIG. 4. Another variation comprises a layer of diffusible highly conductive material such as aluminum, gold, copper or boron (from a layer of boron nitride), similar to layer 56 of the FIG. 5 embodiment, substituted for the doped silicon layer 66 of the FIG. 7 embodiment. Other variations are obtained by altering the orientation of the layers shown in FIGS. 3–7. For example, layers 64 and 66 of FIG. 7 can be reversed. In another variation, layers 55 and 56 of FIG. 5 are reversed, and layer 56 is formed on first metal layer 33 before deposition of dielectric layer 55.

Figure 8:
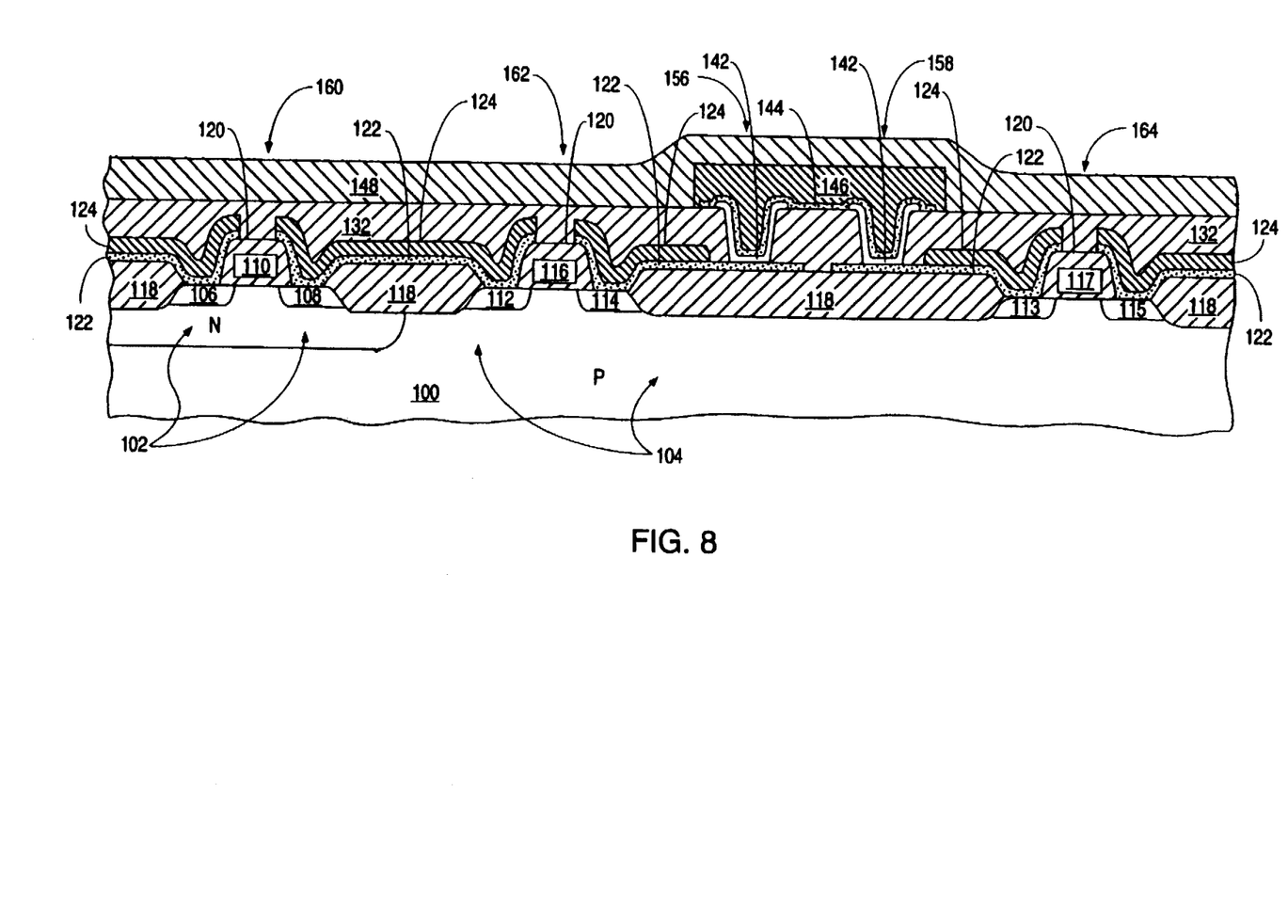
FIG. 8 is a cross-section illustration of a completed programmable CMOS integrated circuit having amorphous silicon antifuses in accordance with the present invention.

A cross sectional view of a CMOS programmable gate array structure having antifuses in accordance with the FIG. 3 embodiment of the present invention is illustrated in FIG. 8. Suitable CMOS processes are well known and commercially available, and the particular CMOS structure shown is exemplary. The present invention is applicable to integrated circuit structures of any type formed by any process, whether memory, logic, digital or analog, and including NMOS, PMOS, Bipolar, BICMOS, Gallium Arsenide, and others.

Substrate 100 is provided with an N-well 102 and P-doped substrate region 104. A PMOS device 160 comprises source and drain regions 106 and 108 and gate 110. A first NMOS device 162 comprises source and drain regions 112 and 114, and gate 116. A second NMOS device 164 comprising source and drain regions 113 and 115 and gate 117 also is present.

Patterned oxide layers 118 and 120 (shown in crosshatch) also are present. As is well known in the art, oxide layer 118 comprises various oxide layers (not shown) including a field oxide, while oxide layer 120 comprises various oxide layers (not shown) formed in the fabrication of gates 110, 116, and 117. The oxide layers 118 and 120 are suitably patterned and etched to form contact holes down to the various source and drain regions 106, 108, 112, 114, 113 and 115.

Using standard techniques, a thin film 122 of TiW measuring about 2500 Angstroms is sputtered over the patterned oxide layers and into the contact holes to regions 106, 108, 112, 114, 113 and 115. Other suitable barrier metals may be used instead of TiW, and the TiW may be combined with other layers such as, for example, platinum silicide at the source and drain regions, as is well known in the art. Using standard techniques, a film 124 of aluminum measuring about 6000 Angstroms is sputtered over the TiW film 122. Other metals may be used as well, as is well known in the art.

First metal lines are formed as follows. The aluminum film 124 is patterned and etched using a BC13, C12, CHC13 standard aluminum dry etch. Using the remaining aluminum as a mask, the TiW film 122 is RIE etched using CHF3 and 02. A metal opening mask is used to pattern openings in the first metal lines, which serve as sites for formation of antifuses 156 and 158. The portions of the aluminum layer 124 remaining after the first aluminum etch is patterned and again etched using a BC13, C12, CHC13 standard aluminum dry etch down to the TiW layer 122.

The second interlevel dielectric is a thick oxide layer 132 of about 9000 Angstroms thickness, deposited using any suitable standard technique such as, for example, plasma enhanced chemical vapor deposition. In one of many suitable techniques, the layer 132 comprises two oxide layers (not shown). The first oxide layer is deposited to a selected thickness and planarized. The planarization step involves spinning a resist layer over the deposited oxide and reflowing the resist with a postbake, after which the surface is planarized in an RIE etch-back adjusted for equal resist and oxide etch rates. A second oxide layer then is deposited to ensure dielectric integrity and a 9000 Angstrom thickness over the irregular topography.

Antifuse vias are now formed through the oxide 132 down to the TiW layer 122. An antifuse via mask similar to the metal opening mask but having smaller via dimensions is used to pattern the oxide, and vias are etched to the TiW layer 122 using standard RIE techniques.

The amorphous silicon material is deposited in the next process step. A thin film 142 of amorphous silicon is deposited over oxide layer 132, and conforms to the topography of the oxide layer 132 and the vias made therein. The layer 142 is patterned and etched to remove amorphous silicon except in the antifuse vias, as shown. Preferably, the amorphous silicon material is deposited using PECVD, as described with respect to FIG. 3 above, although sputter deposition as described with respect to FIG. 3 above is suitable as well. Moreover, any of the various antifuse layers discussed herein may be used as well, together with appropriate modifications to the first and second metal systems.

When the FIG. 3 embodiment is used in an integrated circuit, reproducibility is improved by eliminating aluminum in the conductor underlying the amorphous silicon film. It has been found that the top surface of aluminum conductors such as conductor 124 tend to have an irregular topography when compared with the thickness selected for the amorphous silicon film 142. The irregular topography causes non-uniform antifuse characteristics and shorts. To avoid the problem, the amorphous silicon material is deposited in a via etched down to a thin film refractory metal such as the TiW layer 122, which is deposited on a planarized regular surface such as the oxide 118. Of course, other metal films may be used as well, provided they can be deposited or otherwise processed to present a smooth topography relative to the thickness of the amorphous silicon film 142.

Processing proceeds with the sputter deposition of a thin film 144 of TiW of about 1000 Angstroms, followed by a sputter deposition of an aluminum film 146 of about 1.0 um. The films 144 and 146 are patterned and etched substantially as described above, resulting in the second metal interconnect. The resulting structure is passivated (layer 148) using any suitable technique, such as PECVD of deposition of $SiO_2$.

Completed antifuses 156 and 158 are illustrated in FIG. 8, where they can be programmed to connect NMOS device 162 to second metal interconnect 146, or to connect NMOS device 164 to second metal interconnect 146, or to connect NMOS device 162 to NMOS device 164. Such a programmable element might occur between devices within a circuit block, or in a routing system connecting circuit block to circuit block, or in an interconnect system as between third and fourth metal.

Figure 9:
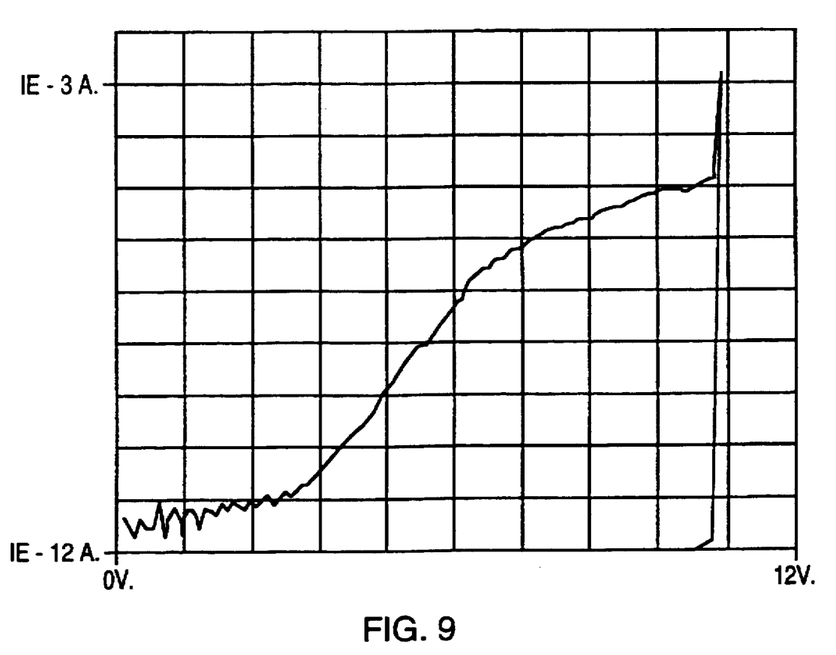
FIG. 9 is a graph illustrating current voltage characteristics of an antifuse fabricated in accordance with the present invention.

The characteristics of an experimental antifuse fabricated by an PECVD process as described with respect to FIG. 3 is illustrated in FIG. 9, which is a current-voltage plot. The preprogramming leakage current at 5.5 volts was 7.6 nA. The programming voltage was 10.6 volts, and the trigger current was 10.9 uA. Generally, PECVD antifuses fabricated as set forth herein have a leakage current of under 10 nanoamperes at 5.5 volts and have a programmed resistance of under 200 ohms, for a programming voltage of about 12 volts, a programming current of 5 mA, and a programming time of 1 msec. Such antifuses are satisfactory for use in such devices as FPGAs. By varying the design, such as providing an aluminum-only metal system about the amorphous silicon antifuse, and by varying other parameters, such as increasing the programming current to 50 mA, a programmed resistance of as little as 9 ohms can be achieved.

While our invention has been described with respect to the embodiments included above, other embodiments and variations not described herein may be considered to be within the scope of our invention. For example, our invention should not be limited by the composition of the metal system used for the interconnects, or to any specific thickness of the various films and oxides used in the structure. These other embodiments and variations are to be considered within the scope of our invention, as defined by the following claims.

What is claimed is:

1. An integrated circuit chip, said integrated circuit chip comprising a substrate, comprising:
   an antifuse element, comprising:
   a first electrode comprising a refractory metal;
   a second electrode comprising a refractory metal, said second electrode not being in direct contact with said substrate and not being in direct contact with said first electrode; and
   a plasma-enhanced chemical vapor deposited (PECVD) amorphous silicon layer disposed between said first and second electrodes, said amorphous silicon layer directly contacting both said first and second electrodes;
   a first metal signal routing line directly contacting said first electrode of said antifuse element but not directly contacting said amorphous silicon layer; and
   a second metal signal routing line directly contacting said second electrode of said antifuse element but not directly contacting said amorphous silicon layer and not directly contacting said first metal signal routing line;
   wherein said antifuse element is characterized by: an unprogrammed resistance of at least 550 megaohms between said first and second metal signal routing lines when said first metal signal routing line has a positive potential of approximately 5 volts with respect to said second metal signal routing line, an unprogrammed resistance of at least 550 megaohms between said first and second metal signal routing lines when said first metal signal routing line has a negative potential with respect to said second metal signal routing line, and a programmed resistance of under 200 ohms between said first and second metal signal routing lines after being programmed with a programming current of about 5 mA for a programming time of about 1 msec.

2. The integrated circuit chip of claim 1, further comprising:
   a layer of oxide having an upper surface, at least a part of said first electrode being disposed over and in direct contact with said upper surface, said amorphous silicon layer being disposed over said upper surface of said oxide but being separated from said upper surface of said oxide by said first electrode, said first metal signal routing line overlaying and contacting said first electrode at a location laterally displaced from a location at which said first electrode contacts said amorphous silicon layer.

3. The integrated circuit chip of claim 1, wherein the integrated circuit chip is a field programmable gate array and the antifuse element is part of a programmable interconnect structure of the field programmable gate array.

* * * * *